US009355854B2

(12) United States Patent
Meitl et al.

(10) Patent No.: US 9,355,854 B2
(45) Date of Patent: May 31, 2016

(54) METHODS OF FABRICATING PRINTABLE COMPOUND SEMICONDUCTOR DEVICES ON RELEASE LAYERS

(75) Inventors: Matthew Meitl, Durham, NC (US); Christopher Bower, Raleigh, NC (US); Etienne Menard, Voglans (FR); James Carter, Chapel Hill, NC (US); Allen Gray, Holly Springs, NC (US); Salvatore Bonafede, Chapel Hll, NC (US)

(73) Assignee: Semprius, Inc., Durham, NC (US)

( * ) Notice: Subject to any disclaimer, the term of this patent is extended or adjusted under 35 U.S.C. 154(b) by 291 days.

(21) Appl. No.: 13/814,343

(22) PCT Filed: Aug. 4, 2011

(86) PCT No.: PCT/US2011/046575
§ 371 (c)(1),
(2), (4) Date: Apr. 15, 2013

(87) PCT Pub. No.: WO2012/018997
PCT Pub. Date: Feb. 9, 2012

(65) Prior Publication Data
US 2013/0196474 A1     Aug. 1, 2013

Related U.S. Application Data

(60) Provisional application No. 61/371,467, filed on Aug. 6, 2010.

(51) Int. Cl.
*H01L 21/82*     (2006.01)
*H01L 21/306*    (2006.01)
(Continued)

(52) U.S. Cl.
CPC ........ *H01L 21/306* (2013.01); *H01L 21/30612* (2013.01); *H01L 23/28* (2013.01);
(Continued)

(58) Field of Classification Search
CPC ............ H01L 21/30612; H01L 21/306; H01L 31/02168; H01L 31/048; H01L 31/1844; H01L 31/1892; H01L 31/184; H01L 23/053; H01L 23/28
See application file for complete search history.

(56) References Cited

U.S. PATENT DOCUMENTS 7,399,693 B2 *   7/2008   Sekiguchi et al. ............ 438/607
2003/0062580 A1 * 4/2003   Sato et al. ..................... 257/421
(Continued)

FOREIGN PATENT DOCUMENTS

JP     2005-108943     4/2005
JP     2005-259912     9/2005
(Continued)

OTHER PUBLICATIONS
International Search Report and Written Opinion, PCT/US2011/046575 mailed Apr. 26, 2012.
(Continued)

*Primary Examiner* — Alonzo Chambliss
(74) *Attorney, Agent, or Firm* — Myers Bigel & Sibley, PA

(57) ABSTRACT

A method of fabricating transferable semiconductor devices includes providing a release layer including indium aluminum phosphide on a substrate, and providing a support layer on the release layer. The support layer and the substrate include respective materials, such as arsenide-based materials, such that the release layer has an etching selectivity relative to the support layer and the substrate. At least one device layer is provided on the support layer. The release layer is selectively etched without substantially etching the support layer and the substrate. Related structures and methods are also discussed.

31 Claims, 3 Drawing Sheets

(51) Int. Cl.
*H01L 31/18* (2006.01)
*H01L 23/28* (2006.01)
*H01L 31/0216* (2014.01)
*H01L 31/048* (2014.01)
H01L 23/053 (2006.01)
H01L 21/02 (2006.01)
H01L 21/78 (2006.01)

(52) U.S. Cl.
CPC ........ *H01L31/02168* (2013.01); *H01L 31/048* (2013.01); *H01L 31/184* (2013.01); *H01L 31/1844* (2013.01); *H01L 31/1892* (2013.01); H01L 21/02395 (2013.01); H01L 21/02461 (2013.01); H01L 21/02546 (2013.01); H01L 21/02549 (2013.01); H01L 21/02664 (2013.01); H01L 21/7813 (2013.01); H01L 23/053 (2013.01); Y02E 10/544 (2013.01)

(56) References Cited

U.S. PATENT DOCUMENTS

2006/0145177 A1   7/2006   Hagimoto et al.
2010/0326518 A1   12/2010  Juso et al.
2015/0137187 A1*  5/2015   Aoki ................ H01L 21/30612
                                                        257/201

FOREIGN PATENT DOCUMENTS

| JP | 2006-108441 | 4/2006 |
| JP | 2009 105450 A | 5/2009 |
| WO | WO 2008/036837 | 3/2008 |
| WO | WO 2009/104561 | 8/2009 |

OTHER PUBLICATIONS

Lothian JR et al., "Wet and Dry Etching Characteristics of A10.5In0.5P", Journal of Vacuum Science & Technology B, Microelectronics Processing and Phenomena USA, vol. 10, No. 3, May 1992, p. 1061-1065.

Yazawa et al., GaInP Single-Junction and GaInP/GaAs Two-Junction Thin-Film Solar Cell Structures by Epitaxial Lift-Off, Solar Energy Materials and Solar Cells, Elsevier Science Publishers, Amsterdam, vol. 50, No. 1-4, Jan. 1, 1998, p. 229-235.

International Preliminary Report on Patentability Corresponding to International Application No. PCT/US2011/046575; Date of Mailing: Feb. 21, 2013; 9 Pages.

* cited by examiner

METHODS OF FABRICATING PRINTABLE COMPOUND SEMICONDUCTOR DEVICES ON RELEASE LAYERS

CLAIM OF PRIORITY

The present application is a 35 U.S.C. §371 national phase application of PCT International Application No. PCT/US2011/046575, entitled "Materials And Processes For Releasing Printable Compound Semiconductor Devices", having an international filing date of Aug. 4, 2011, which claims priority from U.S. Provisional Patent Application No. 61/371,467 entitled "Materials and Processes for Releasing Printable Compound Semiconductor Devices," filed with the United States Patent and Trademark Office on Aug. 6, 2010, the disclosures of which are incorporated by reference herein in their entireties. The above PCT International Application was published in the English language as International Publication No. WO 2012/018997 A3.

FIELD

The present invention relates to compound semiconductor device fabrication, and more particularly, to the fabrication of compound semiconductor devices and structures that may be released from a growth substrate.

BACKGROUND

Selective etching is used in microfabrication processes to chemically remove layers from the surface of a wafer without etching or damaging underlying or overlying layers. In particular, a release layer may be used to separate one or more layers from a wafer or other substrate. For example, United States Patent Application Publication No. 2009/0321881 and U.S. Pat. No. 4,846,931 describe the release of compound semiconductor devices and structures from a gallium arsenide (GaAs) substrate using aluminum gallium arsenide (AlGaAs) layers that have high aluminum content or pure aluminum arsenide (AlAs) as a release layer and hydrofluoric acid-based wet etches for the release agent.

Such systems are typically successful because of the good etching selectivity of hydrofluoric acid with respect to high aluminum content arsenides over low aluminum content arsenides. Some shortcomings of such systems include that the release layer may have poor stability in air, and that it may be difficult to protect the top and sides of the transferrable devices and structures from hydrofluoric acid during the release process without thick (>20 micron) polymeric coatings or other masks. Also, such systems may be nearly or totally incompatible with micro-transfer printing of compound semiconductor devices (as described for example in U.S. Pat. No. 7,622,367, the disclosure of which is incorporated by reference herein in its entirety) such as solar cells that include at their surfaces (especially top surfaces) epitaxial layers of compound semiconductor that contain a significant fraction of aluminum (e.g., the window layer of a solar cell) or many dielectrics (e.g., silicon dioxide anti-reflection coating) because it may be difficult or impossible to protect the surfaces of the devices from the hydrofluoric acid during the release process.

U.S. Pat. No. 5,641,381 describes the release of indium phosphide (InP) devices from an indium phosphide (InP) substrate using indium gallium arsenide (InGaAs) as a release layer. Some shortcomings of this approach may include that the etch rate of indium gallium arsenide (InGaAs) is relatively slow, and that the selectivity of certain wet chemical etches to indium gallium arsenide (InGaAs) over indium phosphide (InP) may be insufficient for very high aspect ratio release processes, in which the lateral expanse of the releasable device is roughly fifty or more times the thickness of the layer of the device above the release layer.

United States Patent Application Publication No. 2008/0054296 describes the use of oxide release layers for nitride-based compound semiconductor light emitters that may be etched selectively using hydrochloric acid or other chemicals. This system may be used successfully when the device is not susceptible to attack by the release chemical.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the disclosure.

Some embodiments of the present invention are directed to a material that enables the release of printable compound semiconductor devices that are sensitive to other release processes.

Some embodiments of the present invention are directed to a process that enables the release of printable compound semiconductor devices that are sensitive to other release processes.

According to some embodiments of the present invention, a method of fabricating transferable semiconductor devices includes providing a release layer including indium aluminum phosphide on a substrate, and providing a support layer on the release layer. The support layer and the substrate include respective materials such that the release layer has an etching selectivity relative to the support layer and the substrate. At least one device layer is provided on the support layer. The release layer is selectively etched without substantially etching the support layer and the substrate.

In some embodiments, the substrate and/or the support layer may be an arsenide-based material, and the release layer may contact and couple the support layer to the substrate.

In some embodiments, providing the release layer, the support layer, and the at least one device layers may include epitaxially growing the release layer comprising indium aluminum phosphide on the substrate comprising the arsenide-based material, epitaxially growing the support layer comprising the arsenide-based material on the release layer, and epitaxially growing the at least one device layer on the support layer.

In some embodiments, the support layer may be under compressive strain relative to the device layer, the release layer, and/or the substrate.

In some embodiments, a lattice mismatch between the release layer and the substrate may be less than about 500 parts-per-million (ppm).

In some embodiments, the substrate and/or the support layer may be a Group III arsenide material and/or a Group III-V arsenide material.

In some embodiments, the arsenide-based material may be indium gallium arsenide, gallium arsenide, indium gallium nitride arsenide, and/or indium gallium nitride arsenide antimonide.

In some embodiments, the indium aluminum phosphide release layer may be selectively laterally etched using an etching solution comprising hydrochloric acid.

In some embodiments, the etching solution may further include ethanol.

In some embodiments, the etching solution may further include a compound configured to form a self-assembled monolayer on the substrate and/or the support layer.

In some embodiments, the release layer may have a thickness of about 0.02 micrometers (μm) to about 1 μm.

In some embodiments, the selective etching may be sufficient to etch the release layer at a rate of more than about 0.1 millimeters (mm) per hour.

In some embodiments, the at least one device layer may laterally extend on the support layer by a distance that is at least about 100 times greater than a thickness of the at least one device layer.

In some embodiments, semiconductor devices may be partially or fully formed on the at least one device layer and a portion of the release layer may be exposed by microfabrication techniques prior to selectively etching the release layer.

In some embodiments, an encapsulation layer may be formed on the at least one device layer prior to selectively etching the release layer.

In some embodiments, the encapsulation layer may be a photoresist material, and the photoresist material may be baked prior to selectively etching the release layer.

In some embodiments, anchoring and/or tethering structures may be formed within the encapsulation layer. In other embodiments, the anchoring and/or tethering structures may be formed within the support layer. The anchoring and/or tethering structures may be configured to maintain spatial orientation of the semiconductor devices during the selective etching.

In some embodiments, the at least one device layer may be an active layer of a photovoltaic cell. Prior to forming the encapsulation layer, an indium aluminum phosphide window layer may be provided on the active layer, and a dielectric anti-reflective coating may be provided on the window layer.

In some embodiments, the at least one device layer may be indium aluminum phosphide and/or aluminum gallium arsenide.

In some embodiments, the support layer may be a Group III arsenide-based lateral conduction layer having a sheet resistance of less than about 50 ohms per square.

In some embodiments, the at least one device layer may be an active layer of a transferable photovoltaic cell, light emitting diode, radio frequency device, or wireless device.

According to further embodiments of the present invention, a transferable semiconductor device includes a support layer and at least one semiconductor device layer on the support layer. A surface of the support layer opposite the at least one device layer includes a portion of an indium aluminum phosphide-based release layer thereon.

According to still further embodiments of the present invention, a compound semiconductor device structure includes a substrate, a release layer comprising indium aluminum phosphide on the substrate, a support layer on the release layer, and at least one transferable semiconductor device layer on the support layer. The substrate and the support layer include respective materials such that the release layer has an etching selectivity relative thereto.

According to other embodiments of the present invention, a compound semiconductor material epitaxial stack for the formation of a printable device includes a gallium arsenide substrate, an indium aluminum phosphide release layer on the substrate, an arsenide-based layer adjacent to the indium aluminum phosphide release layer, and device layers on the arsenide-based layer.

In some embodiments, the release layer may have a thickness between about 20 nanometers and about 1 micron.

In some embodiments, the arsenide-based layer adjacent to the release layer may be indium gallium arsenide, gallium arsenide, indium gallium nitride arsenide, and/or indium gallium nitride arsenide antimonide.

In some embodiments, the arsenide-based layer adjacent to the release layer may be grown in compression relative to some part of the device, the release layer, and/or the substrate.

In some embodiments, the device layers may form the active materials for photovoltaic cells, light-emitting diodes, lasers, radio-frequency or wireless devices.

In some embodiments, the device layers may include indium aluminum phosphide and/or aluminum gallium arsenide.

According to still other embodiments of the present invention, a process of releasing printable devices from a gallium arsenide substrate includes selectively laterally etching a release layer of indium aluminum phosphide in a mixture of hydrochloric acid and ethanol. The mixture may further include a compound that forms self-assembled monolayers on compound semiconductors.

According to yet other embodiments of the present invention, a method of preparing a releasable printable device includes epitaxially growing on a gallium arsenide substrate an indium aluminum phosphide release layer, an arsenide-based layer adjacent to the release layer, and device layers, thereby forming an epi-stack; partially or fully forming functional devices on the epi-stack and exposing some portion of the release layer by microfabrication techniques; and selectively laterally etching the release layer in a mixture of hydrochloric acid and ethanol, thereby releasing the devices.

In some embodiments, the microfabrication techniques may further include the application and baking of photoresist to protect the partially or fully formed devices from chemical attack by the mixture of hydrochloric acid and ethanol.

In some embodiments, the microfabrication techniques may further include forming anchoring and tethering structures to maintain spatial orientation of the printable devices through the release process.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION OF EMBODIMENTS

Figure 1A:
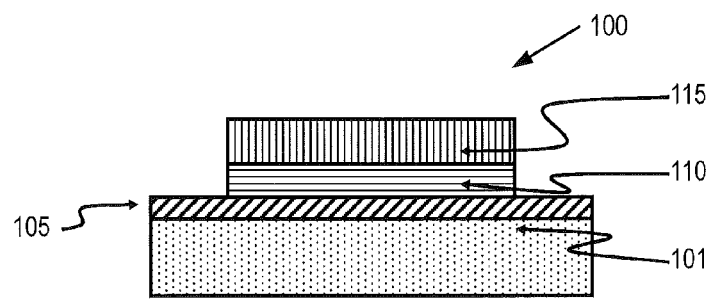
FIGS. 1A-1C are cross-sectional views illustrating structures and methods for fabricating printable compound semiconductor devices according to some embodiments of the present invention.

The present invention is described herein with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "in contact with" or "connected to" or "coupled to" another element, it can be directly contacting or connected to or coupled to the other element or intervening elements may be present. In contrast, when an element is referred to as being "in direct contact with" or "directly connected to" or "directly coupled to" another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "under" or "lower" or "bottom," and "over" or "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In other words, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

As used herein the expressions "semiconductor component," "semiconductor element," and "semiconductor structure" are used synonymously and broadly refer to a semiconductor material, structure, layer, device, and/or component of a device. Semiconductor elements include high quality single crystalline and polycrystalline semiconductors, semiconductor materials fabricated via high temperature processing, doped semiconductor materials, organic and inorganic semiconductors and composite semiconductor materials and structures having one or more additional semiconductor components and/or non-semiconductor components, such as dielectric layers or materials and/or conducting layers or materials. Semiconductor elements include semiconductor devices and device components including, but not limited to, transistors, photovoltaics including solar cells, diodes, light emitting diodes, lasers, p-n junctions, photodiodes, integrated circuits, and sensors. In addition, semiconductor elements refer to a part or portion that forms an end functional semiconductor.

"Printing" refers to a process of transferring a feature, such as a semiconductor component or element, from a first surface to a second surface. In some embodiments, the first surface is a donor surface and the second surface a receiving surface, and the transfer is mediated by an intermediate surface, such as an elastomeric stamp, which is capable of releasing the elements to a receiving surface on a target substrate, thereby transferring the semiconductor element. In some embodiments, the printing is dry transfer printing of printable semiconductors, wherein the adhesive force between a solid object and the stamp surface is rate-sensitive. Transfer printing methods are further described, for example, in U.S. patent application Ser. No. 11/145,574 filed Jun. 2, 2005, the disclosure of which is incorporated by reference herein.

Some embodiments of the present invention provide a release layer that is compatible with methods for releasing printable or transferrable compound semiconductor devices. The release layer has a high etching selectivity relative to that of the semiconductor device layers and/or the support layer (such as an arsenide-based support layer) on which the semiconductor device layers are provided, and can be grown on a same substrate as the device layer(s) and/or support layer in some embodiments. In particular embodiments, the release layer includes indium aluminum phosphide (InAlP), and can be disposed between layers of arsenide-based Group III-V materials such as indium gallium arsenide, gallium arsenide, indium gallium nitride arsenide, indium gallium nitride arsenide antimonide or variants thereof. According to some aspects of the present invention, InAlP offers significant practical benefits in the fabrication of transferrable semiconductor devices in that it may be grown epitaxially on gallium arsenide substrates.

Embodiments of the present invention also provide a wet chemical release process for selectively laterally etching a release layer including InAlP without substantially etching the arsenide-based materials adjacent to the InAlP layer, by using an etchant or etching solution that includes a mixture of hydrochloric acid (HCl) and ethanol. The use of a hydrochloric acid-based etching solution to etch the release layer may offer several advantages over conventional hydrofluoric acid (HF)-based wet etching. For example, while HF may provide good etching selectivity with respect to high aluminum content arsenide-based release layers, it may be difficult to protect the active layers of the device from the HF-based etchant. HCl, in contrast, offer good etching selectivity to InAlP, and the active device layers may be more easily encapsulated against an HCl-based etchant.

Embodiments of the invention may simultaneously provide several advantages. For example, release layers in accordance with embodiments of the present invention may be satisfactorily stable in air, and may be lattice-matched to common compound semiconductor substrates. The release layers also provide a relatively high etch rate, for instance, to release devices at a rate greater than 0.1 millimeters per hour. In addition, the release layers described herein provide very good selectivity in the etch rate of the release layer relative to an adjacent arsenide device layer, sufficient to release devices with lateral expanse many hundreds or thousands of times greater than the thickness of the device layer adjacent to the release layer. Release processes according to embodiments of the present invention are compatible with readily-available encapsulation (e.g., using photoresist) of the device layers, and thus, are compatible with printable compound semiconductor devices that include materials that would otherwise be easily attacked by the release chemistry (e.g., InAlP, AlGaAs). In some embodiments, the use of ethanol or other surfactants in the release process can reduce the size of bubbles evolved during the chemical etching process of the InAlP. Without ethanol or another suitable surfactant, the release process may produce large bubbles and can damage the printable and/or releasable devices.

The combination of the above and other advantages may not be offered by other release layer materials and/or processes for releasing compound semiconductor devices. Accordingly, embodiments of the present invention can facilitate the fabrication of compound semiconductor devices (such as photovoltaic cells, light-emitting diodes, lasers, and radio-frequency or wireless devices) that can be transferred to or printed on a receiving/destination substrate different from a growth substrate or other donor/source substrate by microtransfer printing using stamps or other conformable transfer elements.

Figure 1B:
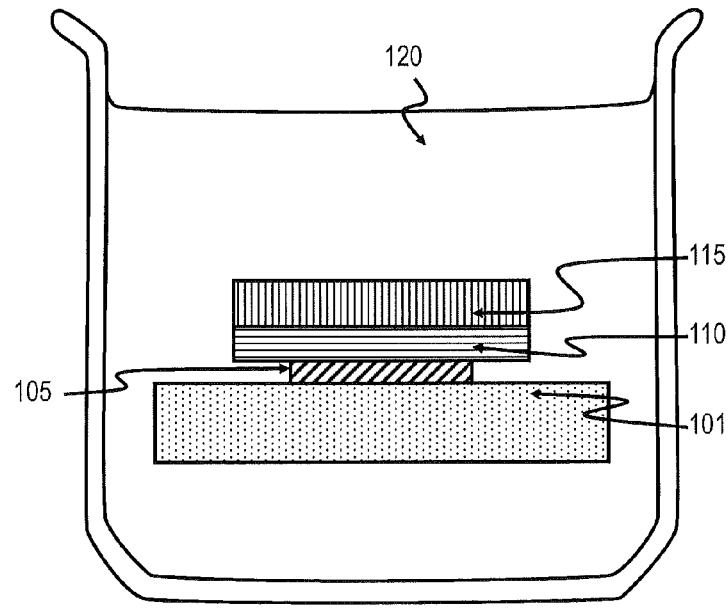
Figure 1C:
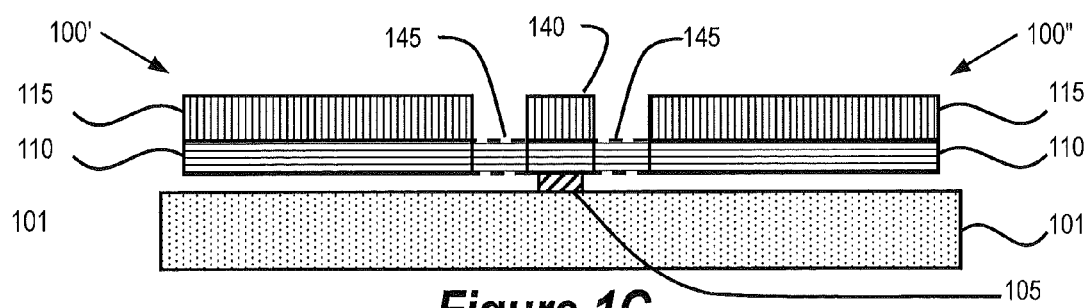

FIGS. 1A-1C illustrate compound semiconductor device structures and methods of fabrication according to some embodiments of the present invention. As shown in FIG. 1A, a printable compound semiconductor device structure 100 includes a wafer or substrate 101, a release layer 105 on the substrate 101, a support layer 110 on the release layer 105, and one or more printable or transferrable device layers 115 on the support layer 110. The release layer 105 contacts and couples the support layer 110 to the substrate 101. In the embodiments of FIGS. 1A-1C, the release layer 105 is an indium aluminum phosphide (InAlP) layer, and the substrate 101 and the support layer 110 are formed of arsenide-based materials. The InAlP release layer 105 may have a thickness between about 0.02 microns (or micrometers (μm)) and about 1 micron.

The layers 105, 110, and/or 115 may be epitaxially grown on the substrate 101. In particular, the indium-phosphide release layer 105 may be epitaxially grown on the arsenide-based source substrate 101. For example, where the source substrate 101 is GaAs, the InAlP release layer 105 may be epitaxially grown on and closely lattice-matched to (e.g., at a lattice mismatch of less than about 500 parts-per million (ppm) as measured by X-ray diffractometry) the GaAs substrate 101. Also, the arsenide based support layer 110 may be epitaxially grown on the release layer 105, and the device layer(s) 115 may be epitaxially grown on the support layer 110. In some embodiments, at least a portion of the support layer 110 exhibits compressive strain relative to the device layer(s) 115, the release layer 105, and/or the substrate 101. In particular, in FIG. 1A, at least a portion of the arsenide-based support layer 110 adjacent to the release layer 105 is grown in slight compression relative to some part of the release layer 105, the substrate 101, and/or the device layer(s) 115.

Semiconductor devices, such as transistors, photovoltaic cells, light emitting diodes, and/or radio frequency or other wireless devices, may be partially or fully formed in or on the device layer(s) 115 by microfabrication techniques prior to separating the device layer(s) 115 from the growth substrate 101. Also, anchoring and/or tethering structures (not shown) may be formed in the support layer 110 and/or other layers, and may be configured to maintain spatial orientation of the semiconductor devices during subsequent operations for separating the device layer(s) 115 from the substrate 101. The fabrication of such anchoring and/or tethering structures are described, for example, in PCT Application Nos. PCT/US2011/029365 and PCT/US2011/029357 filed Mar. 22, 2011, and PCT/US2010/28844 filed Mar. 26, 2010, the disclosures of which is incorporated by reference herein. An encapsulation structure (not shown) may be further provided on the device layer(s) 115 to protect the partially or fully formed devices from chemical attack during subsequent processing.

More particularly, as shown in FIG. 1B, the release layer 105 can be selectively etched without substantially etching the support layer 110, the device layer(s) 115, and/or the substrate 101. As such, the substrate 101 and the support layer 110 respectively include a material having etching selectivity with respect to that of the release layer 105. In particular, FIG. 1B illustrates a process of releasing printable devices formed in or on the device layer(s) 115 from an arsenide-based substrate 101 by selectively laterally etching the InAlP release layer 105 in a solution 120 including hydrochloric acid to separate the arsenide-based support layer 110 and the device layer(s) 115 thereon from the substrate 101. In some embodiments, the substrate 101 and/or the support layer 110 may include a Group III arsenide material (such as gallium arsenide (GaAs) and indium gallium arsenide (InGaAs)) and/or a Group III-V arsenide material (such as indium gallium nitride arsenide (InGaNAs) and indium gallium nitride arsenide antimonide (InGaNAsSb)). In some embodiments, (for example, where the above-described encapsulation layer is used), the device layer(s) 115 may be formed of indium aluminum phosphide (InAlP), aluminum gallium arsenide (AlGaAs), and/or other materials that would be otherwise etched along with the release layer 105.

The etching solution 120 may also include ethanol in some embodiments. In addition, the release process and/or the etching solution 120 described herein can further include a compound that is configured to form a self-assembled monolayer on compound semiconductor surfaces (e.g., 1-hexadecanethiol), to lubricate the surfaces of the structure 100 that become exposed during the release process and/or to change the surface tension of the etching solution 120.

The release process illustrated in FIG. 1B is sufficient to separate the support layer 110 from the substrate 101 at a relatively high etch rate of more than about 0.1 millimeters (mm) per hour. The InAlP release layer 105 described herein also provides very good selectivity in the relative to the arsenide-based layers 101 and 110, which allows for release of device layer(s) 115 that laterally extend up to at least 100 times greater than a thickness of the device layer(s)115. As such, embodiments of the present invention allow for selectively laterally etching an indium aluminum phosphide release layer 105 using an etching solution 120 including hydrochloric acid to separate the arsenide-based support layer 110 including the device layer(s) 115 thereon from the arsenide-based substrate 101.

Once separated, the device layer(s) 115 including the semiconductor devices therein can be transferred to a different target or destination substrate, for example, using stamp-based and/or other micro-transfer printing techniques. FIG. 1C illustrates two transferable devices or chiplets 100' and 100" after etching of the release layer 105 according to embodiments as described herein. As shown in FIG. 1C, the transferable devices 100' and 100" are attached to a portion 140 of the support layer 110 by breakable micro-bridges or tethers 145, and the portion 140 of the support layer 110 remains attached to the substrate 101 by a portion of the release layer 105 that remains after the selective etching process shown in FIG. 1B. Also, the surface of the support layer 110 opposite the device layer(s) 115 may include at least some remaining portion or residue or trace amounts of the InAlP release layer 105 thereon (not shown). For example, while the released devices 100' and 100" may be washed with an aqueous solution of hydrogen peroxide, some phosphorous-containing residues (e.g., products of the release layer etching reaction) may still persist on the surface of the support layer 110. The devices 100' and 100" can then be transferred to a different target substrate by pressing or contacting an elastomeric stamp (or other intermediary transfer element) against the devices 100' and 100", where the stamp has an adhesive strength sufficient to sufficient to break the tethers 145 and transfer the devices 100' and 100" to a desired destination substrate.

Figure 2A:
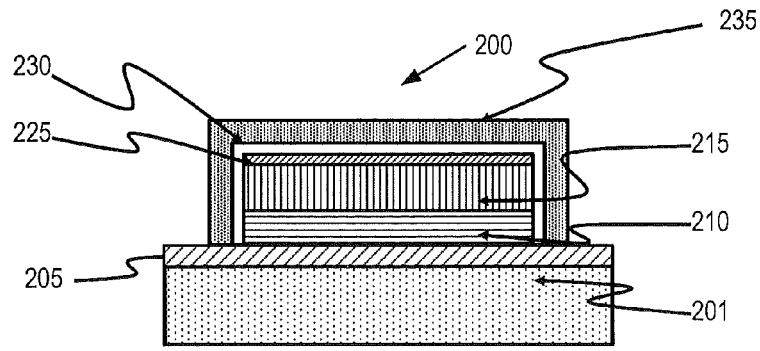
FIGS. 2A-2C are a cross-sectional views illustrating structures and methods for fabricating printable compound semiconductor devices according to further embodiments of the present invention that include an encapsulation layer.
Figure 2B:
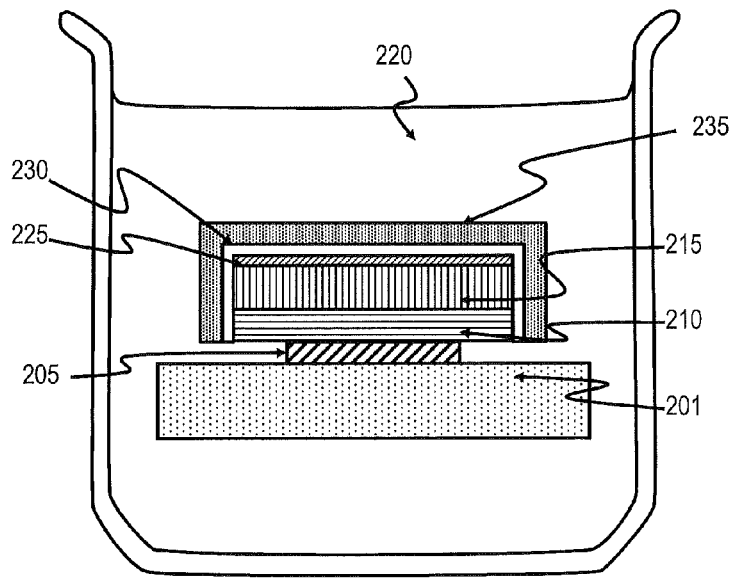
Figure 2C:
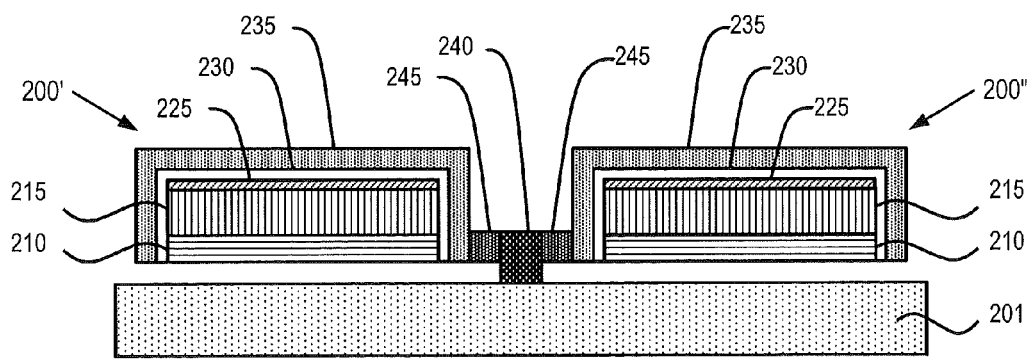

FIGS. 2A-2C illustrate compound semiconductor device structures and methods of fabrication according to further embodiments of the present invention. As shown in FIG. 2A, a printable compound semiconductor device structure 200 includes a wafer or substrate 201, a release layer 205 on the substrate 201, a support layer 210 on the release layer 205, and one or more printable or transferrable device layers 215 on the support layer 210. In some embodiments, the release layer 205 is an InAlP-based layer, and the support layer 210 is a Group III arsenide-based lateral conduction layer adjacent to the release layer 205 that provides a relatively low sheet resistance (e.g., less than about 50 ohms per square). For example, the support layer 210 may be formed of GaAs, InGaAs, InGaNAsSb, or InGaNAs in some embodiments. As similarly noted above, the substrate 201 may include a Group III arsenide material (such as gallium arsenide (GaAs) and indium gallium arsenide (InGaAs)) and/or a Group III-V arsenide material (such as indium gallium nitride arsenide (InGaNAs) and indium gallium nitride arsenide antimonide (InGaNAsSb)).

The substrate 201 may be a source or growth substrate, and the layers 205, 210, and/or 215 may be epitaxially grown on the substrate 201 in some embodiments. The structure 200 may further include a layer of GaAs, InGaAs, InGaNAsSb, and/or InGaNAs adjacent to the release layer 205 that is grown in slight compression (e.g., having a lattice mismatch of about 100 ppm to about 1000 ppm as measured by X-ray diffractometry) relative to some part of the device layer(s) 215, the release layer 205, and/or the substrate 201.

In the embodiments of FIGS. 2A-2C, the printable device layers(s) 215 provide active layers for one or more photovoltaic or solar cells. A partially transparent window layer 225 is provided on an upper surface of the device layers(s) 215, and a dielectric anti-reflection coating 230 is provided on the window layer 225. The dielectric anti-reflection coating 230 may further cover sidewalls of the device layers(s) 215 and the support layer 210. The dielectric anti-reflection coating 230 may be a single- or multi-layer coating. In the embodiments of FIGS. 2A-2C, the dielectric anti-reflection coating 230 is further covered by an encapsulation layer 235 that surrounds the solar cells in or on the device layer(s) 215. For example, the dielectric anti-reflection coating 230 may be covered with photoresist, and the photoresist may be subsequently baked to provide the encapsulation layer 235 that protects the device layers(s) 215 during a subsequent release process, as shown in FIG. 2B.

Referring now to FIG. 2B, the release layer 205 is selectively etched without substantially etching the support layer 210, the device layer(s) 215, and/or the substrate 201. In particular, as the release layer 205 is formed of a material (InAlP) that provides etching selectivity to the arsenide-based substrate 201, the release layer 205 can be selectively laterally etched in a solution 220 including hydrochloric acid to separate the support layer 210 and the device layer(s) 215 thereon from the substrate 201. The encapsulation layer 235 provides further protection for the device layer(s) 215, the window layer 225, and the dielectric anti-reflection coating 230 from attack by the solution 220 used to selectively etch the release layer 205. For example, due to the protection provided by the encapsulation layer 235, the window layer 225 may be formed of InAlP and/or other materials that would otherwise be etched by the etching solution 220 in some embodiments. Likewise, the device layer(s) may be formed of indium aluminum phosphide and/or aluminum gallium arsenide. The etching solution 220 may also include ethanol and/or a compound that is configured to form a self-assembled monolayer on compound semiconductor surfaces in some embodiments. Thus, the active layer(s) 215 of the solar cell may be separated from the arsenide-based substrate 201 without damage to the solar cell, window layer, and/or anti-reflective coating thereon.

The solar cell can then be transferred to or printed onto a different receiving/destination substrate by micro-transfer printing using stamps or other conformable transfer elements. FIG. 2C illustrates two transferable solar cell devices or chiplets 200' and 200" after etching of the release layer 205 according to embodiments as described herein. As shown in FIG. 2C, the transferable devices 200' and 200" are attached to breakable tethers 245 that are attached to anchors 240 that are also attached to the substrate 201 throughout and after the selective etching process shown in FIG. 2B. In some embodiments, the tethers 245 and anchors 240 are formed within the encapsulation layer 235. The surface of the support layer 210 opposite the device layer(s) 215 may also include at least some remaining portion or residue of the InAlP release layer 205 thereon (not shown). The devices 200' and 200" can then be transferred to a different target substrate by pressing or contacting an elastomeric stamp or other intermediary transfer element against the devices 200' and 200" with a force sufficient to break the tethers 245, where the stamp has an adhesive strength sufficient to transfer the devices 200' and 200" to a desired destination substrate.

Figure 3:
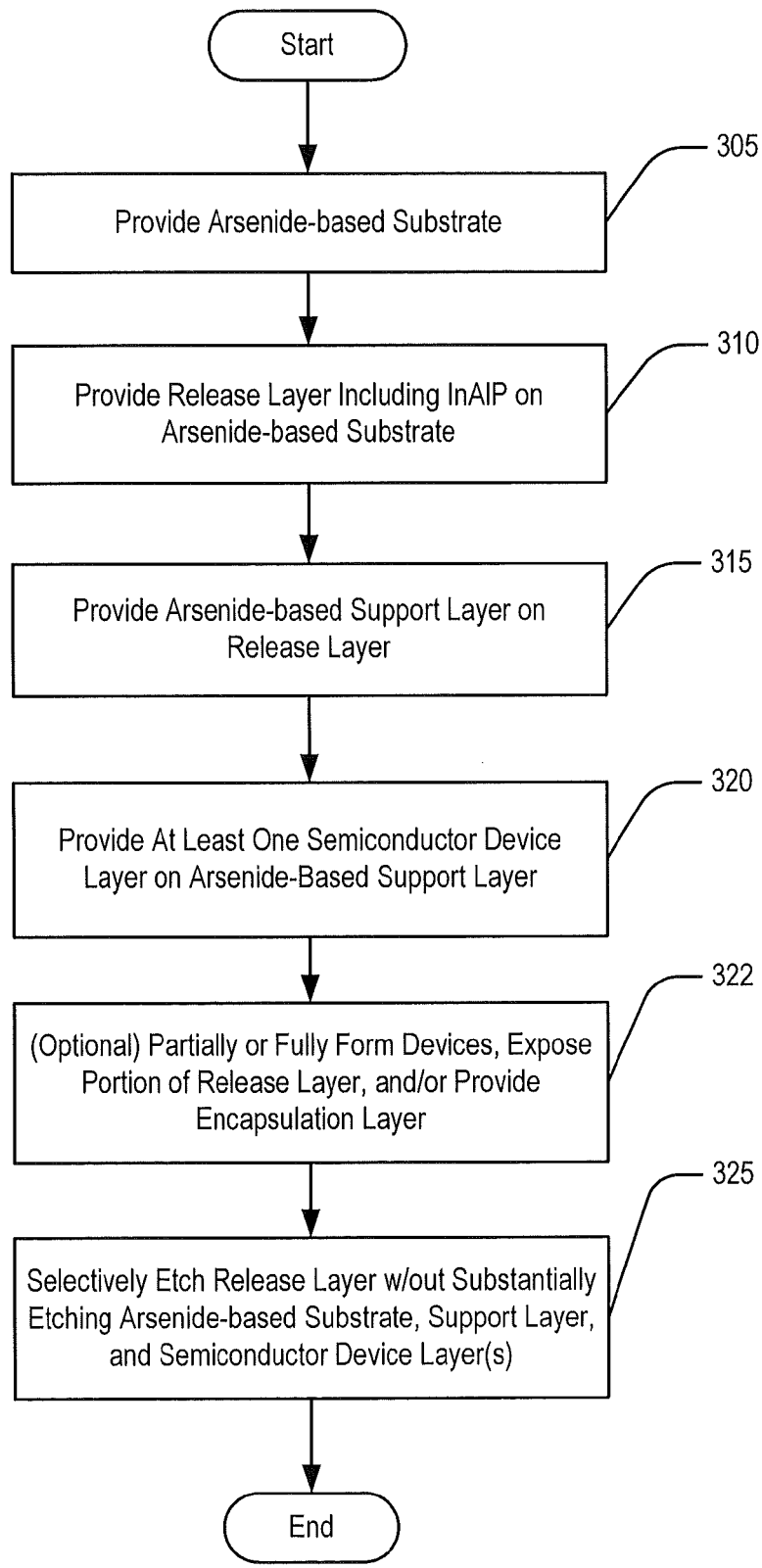
FIG. 3 is a flowchart illustrating methods for fabricating printable compound semiconductor devices according to some embodiments of the present invention.

FIG. 3 is a flowchart illustrating methods of fabricating printable compound semiconductor device structures and releasing such structures from a growth substrate or other donor substrate in accordance with embodiments of the present invention. As shown in FIG. 3, an arsenide-based substrate is provided at block 305. A release layer including indium aluminum phosphide (InAlP), an arsenide-based support layer, and at least one semiconductor device layer are sequentially provided on the arsenide-based substrate at blocks 310, 315, and 320, respectively. The release layer, the support layer, and/or the device layer(s) may be epitaxially grown on the arsenide-based substrate in some embodiments to define an epi-stack structure. One or more semiconductor devices, such as transistors, photovoltaic cells, and/or light-emitting diodes, may be formed in/on the device layer(s) using microfabrication techniques at block 322. Also, one or more portions of the release layer may also be exposed using microfabrication techniques at block 322.

Still referring to FIG. 3, the material of the release layer provides an etching selectivity to the material(s) of the arsenide-based substrate and/or support layer. As such, at block 325, the release layer is selectively etched without substantially etching the substrate and/or support layer. In particular, an etchant including hydrochloric (HCl) acid may be used to selectively laterally etch the InAlP release layer without substantially etching the arsenide-based layers. The etchant may further include ethanol or another suitable surfactant to reduce the size of bubbles that may be produced during the etching of the InAlP release layer, thereby reducing the likelihood of damage to the device structure. In some embodiments, an encapsulant layer may be provided on the device layer(s) and/or other portions of the device structure to protect layers that may be otherwise vulnerable to the etchant. The etchant including HCl and ethanol may selectively etch the release layer at a relatively high rate (for example, at more than about 0.1 millimeters (mm) per hour) to thereby separate the support layer from the substrate. The device layer(s) may then be transferred to a different substrate, for example, using micro-transfer printing techniques.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the specification, there have been disclosed embodiments of the invention and, although specific terms are employed, they are used in a generic and descriptive sense only and not for purposes of limitation. Hence, it is intended that the above embodiments and all of such variations and modifications be included within the scope and spirit of the invention, as defined by the claims that follow.

That which is claimed:

1. A method of fabricating transferable semiconductor devices, the method comprising:
providing a release layer comprising indium aluminum phosphide on a substrate;
providing a support layer on the release layer, the support layer and the substrate comprising respective materials such that the release layer has an etching selectivity relative to the support layer and the substrate;
providing at least one device layer on the support layer;
forming a device in the device layer; and
selectively etching the release layer without substantially etching the support layer and the substrate to form a patterned release layer beneath the device and a tether connecting the device to an anchor in the support layer.

2. The method of claim 1, wherein the substrate and/or the support layer comprise an arsenide-based material, and wherein the release layer contacts and couples the support layer to the substrate.

3. The method of claim 2, wherein providing the release layer, the support layer, and the at least one device layer comprises:
epitaxially growing the release layer comprising indium aluminum phosphide on the substrate comprising the arsenide-based material;
epitaxially growing the support layer comprising the arsenide-based material on the release layer; and
epitaxially growing the at least one device layer on the support layer.

4. The method of claim 3, wherein a lattice mismatch between the release layer and the substrate is less than about 500 parts-per-million (ppm).

5. The method of claim 3, wherein the support layer is under compressive strain relative to the device layer, the release layer, and/or the substrate.

6. The method of claim 2, wherein the substrate and/or the support layer comprise a Group III arsenide material and/or a Group III-V arsenide material.

7. The method of claim 6, wherein the arsenide-based material comprises indium gallium arsenide, gallium arsenide, indium gallium nitride arsenide, and/or indium gallium nitride arsenide antimonide.

8. The method of claim 1, wherein selectively etching comprises:
selectively laterally etching the indium aluminum phosphide release layer using an etching solution comprising hydrochloric acid.

9. The method of claim 8, wherein the release layer has a thickness of about 0.02 micrometers ($\mu$m) to about 1 $\mu$m, and wherein the selective etching is sufficient to etch the release layer at a rate of more than about 0.1 millimeters (mm) per hour.

10. The method of claim 1, wherein the at least one device layer laterally extends on the support layer by a distance that is at least about 100 times greater than a thickness of the at least one device layer.

11. The method of claim 1, further comprising:
partially or fully forming semiconductor devices on the at least one device layer and exposing a portion of the release layer by microfabrication techniques prior to selectively etching the release layer.

12. The method of claim 1, further comprising:
forming an encapsulation layer on the at least one device layer prior to selectively etching the release layer.

13. The method of claim 12, wherein the at least one device layer comprises indium aluminum phosphide and/or aluminum gallium arsenide.

14. The method of claim 1, wherein the support layer comprises a Group III arsenide-based lateral conduction layer having a sheet resistance of less than about 50 ohms per square.

15. The method of claim 1, wherein the at least one device layer comprises an active layer of a transferable photovoltaic cell, light emitting diode, radio frequency device, or wireless device.

16. A method of fabricating transferable semiconductor devices, the method comprising;
providing a release layer comprising indium aluminum phosphide on a substrate; providing a support layer on the release layer, the support layer and the substrate comprising respective materials such that the release layer has an etching selectivity relative to the support layer and the substrate;
providing at least one device layer on the support layer; and
selectively etching the release layer without substantially etching the support layer and the substrate,
wherein selectively etching comprises selectively laterally etching the release layer using an etching solution comprising hydrochloric acid, and wherein the etching solution further comprises ethanol.

17. The method of claim 16, wherein the etching solution further comprises a compound configured to form a self-assembled monolayer on the substrate and/or the support layer.

18. A method of fabricating transferable semiconductor devices, the method comprising:
providing a release layer comprising indium aluminum phosphide on a substrate;
providing a support layer on the release layer, the support layer and the substrate comprising respective materials such that the release layer has an etching selectivity relative to the support layer and the substrate;
providing at least one device layer on the support layer;
selectively etching the release layer without substantially etching the support layer and the substrate;
forming an encapsulation layer on the at least one device layer prior to selectively etching the release layer, wherein the encapsulation layer comprises a photoresist material; and
baking the photoresist material prior to selectively etching the release layer.

19. A method of fabricating transferable semiconductor devices, the method comprising:
providing a release layer comprising indium aluminum phosphide on a substrate;
providing a support layer on the release layer, the support layer and the substrate comprising respective materials such that the release layer has an etching selectivity relative to the support layer and the substrate;
providing at least one device layer on the support layer;
selectively etching the release layer without substantially etching the support layer and the substrate;
forming an encapsulation layer on the at least one device layer prior to selectively etching the release layer; and
forming anchoring and/or tethering structures in the encapsulation layer, wherein the anchoring and/or tethering structures are configured to maintain spatial orientation of the semiconductor devices during and after the selective etching.

20. A method of fabricating transferable semiconductor devices, the method comprising:
providing a release layer comprising indium aluminum phosphide on a substrate;
providing a support layer on the release layer, the support layer and the substrate comprising respective materials such that the release layer has an etching selectivity relative to the support layer and the substrate;
providing at least one device layer on the support layer;
selectively etching the release layer without substantially etching the support layer and the substrate; and
forming an encapsulation layer on the at least one device layer prior to selectively etching the release layer,
wherein the at least one device layer comprises an active layer of a photovoltaic cell, and further comprising the following prior to forming the encapsulation layer:
providing an indium aluminum phosphide window layer on the active layer; and
providing a dielectric anti-reflective coating on the window layer.

21. A process of releasing printable devices from a gallium arsenide substrate, comprising:
providing a release layer of indium aluminum phosphide on the gallium arsenide substrate, a layer on the release layer of indium aluminum phosphide, and at least one device layer on the support layer; and
selectively laterally etching the release layer of indium aluminum phosphide in a mixture of hydrochloric acid and ethanol.

22. The process of claim 21, wherein the mixture further includes a compound that forms self-assembled monolayers on compound semiconductors.

23. A method of preparing a releasable printable device, comprising:
epitaxially growing on a gallium arsenide substrate an indium aluminum phosphide release layer, an arsenide-based layer adjacent to the release layer, and device layers, thereby forming an epi-stack;
partially or fully forming functional devices on the epi-stack and exposing some portion of the release layer by microfabrication techniques; and
selectively laterally etching the release layer in a mixture of hydrochloric acid and ethanol, thereby releasing the devices.

24. The method of claim 23, wherein the release layer has a thickness between about 20 nanometers and about 1 micron.

25. The method of claim 23, wherein the arsenide-based layer adjacent to the release layer comprises indium gallium arsenide, gallium arsenide, indium gallium nitride arsenide, and/or indium gallium nitride arsenide antimonide.

26. The method of claim 23, wherein the arsenide-based layer adjacent to the release layer is grown in compression relative to some part of the device, the release layer, and/or the substrate.

27. The method of claim 23, wherein the device layers form the active materials for photovoltaic cells, light-emitting diodes, lasers, radio-frequency or wireless devices.

28. The method of claim 23, wherein the device layers include indium aluminum phosphide and/or aluminum gallium arsenide.

29. The method of claim 23, wherein the microfabrication techniques further include the application and baking of photoresist to protect the partially or fully formed devices from chemical attack by the mixture of hydrochloric acid and ethanol.

30. The method of claim 29, wherein the microfabrication techniques further include forming anchoring and tethering structures in the photoresist.

31. The method of claim 23, wherein the microfabrication techniques further include forming anchoring and tethering structures to maintain spatial orientation of the printable devices through the release process.

* * * * *